(12) United States Patent
Lam et al.

(10) Patent No.: US 11,580,370 B2
(45) Date of Patent: Feb. 14, 2023

(54) ARTIFICIAL NEUROMORPHIC CIRCUIT AND OPERATION METHOD

(71) Applicants: Jiangsu Advanced Memory Technology Co., Ltd., Jiangsu (CN); ALTO MEMORY TECHNOLOGY CORPORATION, Hsinchu County (TW)

(72) Inventors: Chung-Hon Lam, Hsinchu County (TW); Ching-Sung Chiu, Hsinchu County (TW)

(73) Assignees: JIANGSU ADVANCED MEMORY TECHNOLOGY CO., LTD., Jiangsu (CN); ALTO MEMORY TECHNOLOGY CORPORATION, Hsinchu County (TW)

( * ) Notice: Subject to any disclaimer, the term of this patent is extended or adjusted under 35 U.S.C. 154(b) by 316 days.

(21) Appl. No.: 16/772,164

(22) PCT Filed: Nov. 15, 2019

(86) PCT No.: PCT/CN2019/118793
§ 371 (c)(1),
(2) Date: Jun. 12, 2020

(87) PCT Pub. No.: WO2021/092896
PCT Pub. Date: May 20, 2021

(65) Prior Publication Data
US 2021/0406650 A1    Dec. 30, 2021

(51) Int. Cl.
*G11C 13/00*       (2006.01)
*G11C 11/00*       (2006.01)
(Continued)

(52) U.S. Cl.
CPC .............. *G06N 3/063* (2013.01); *G11C 11/54* (2013.01); *G11C 13/0004* (2013.01)

(58) Field of Classification Search
CPC ...... G06N 3/063; G06N 3/049; G06N 3/0635; G06N 3/061; G11C 11/54; G11C 13/0004
See application file for complete search history.

(56) References Cited

U.S. PATENT DOCUMENTS 9,830,981 B2   11/2017  Kim et al.
10,318,861 B2   6/2019  Eleftheriou et al.
(Continued)

FOREIGN PATENT DOCUMENTS

CN      102543172 A    7/2012
CN      102610274 A    7/2012
(Continued)

OTHER PUBLICATIONS

Chung H. Lam, "Neuromorphic Semiconductor Memory", IEEE 2015 International 3D Systems Integration Conference.
(Continued)

*Primary Examiner* — Hien N Nguyen
(74) *Attorney, Agent, or Firm* — CKC & Partners Co., LLC

(57) ABSTRACT

Artificial neuromorphic circuit includes synapse and post-neuron circuits. Synapse circuit includes phase change element and receives first and second pulse signals. Post-neuron circuit includes input, output and integration terminals. Integration terminal is charged to membrane potential according to first pulse signal. Post-neuron circuit further includes first and second control circuits, and first and second delay circuits. First control circuit generates firing signal at output terminal based on membrane potential. Second control circuit generates first control signal based on firing signal. First delay circuit delays firing signal to generate second control signal. Second delay circuit delays second control signal to generate third control signal. First and third control signals control voltage level of integration terminal, maintain integration terminal at fixed (Continued)

US 11,580,370 B2

Page 2 voltage during period, and second control signal cooperates with second pulse signal to control state of phase change element to determine weight of artificial neuromorphic circuit.

16 Claims, 10 Drawing Sheets

(51) Int. Cl.
*G06N 3/063* (2023.01)
*G11C 11/54* (2006.01)

(56) References Cited

U.S. PATENT DOCUMENTS

| | | |
|---|---|---|
| 2010/0299297 A1 | 11/2010 | Breitwisch et al. |
| 2015/0278682 A1 | 10/2015 | Saxena |
| 2016/0203400 A1 | 7/2016 | Kim et al. |
| 2016/0203858 A1 | 7/2016 | Kim et al. |
| 2016/0350643 A1 | 12/2016 | Hosokawa et al. |
| 2016/0350647 A1 | 12/2016 | Hosokawa et al. |
| 2016/0371583 A1 | 12/2016 | Hosokawa et al. |
| 2017/0364793 A1 | 12/2017 | Kim et al. |
| 2017/0364801 A1 | 12/2017 | Kim et al. |
| 2019/0065929 A1 | 2/2019 | Koelmans et al. |
| 2021/0406651 A1* | 12/2021 | Lam ................. G06N 3/049 |

FOREIGN PATENT DOCUMENTS

| | | |
|---|---|---|
| CN | 102667826 A | 9/2012 |
| CN | 106447033 A | 2/2017 |
| CN | 106470023 A | 3/2017 |
| CN | 106796669 A | 5/2017 |
| CN | 106815636 A | 6/2017 |
| CN | 107111783 A | 8/2017 |
| CN | 107615307 A | 1/2018 |
| CN | 108780520 A | 11/2018 |
| CN | 108921290 A | 11/2018 |
| CN | 109255435 A | 1/2019 |
| CN | 109727678 A | 5/2019 |
| CN | 110188873 A | 8/2019 |

OTHER PUBLICATIONS

S. Kim et al., "NVM Neuromorphic Core with 64k-cell (256-by-256) Phase Change Memory Synaptic Array with On-Chip Neuron Circuits for Continuous In-Situ Learning", 2015 IEEE International Electron Devices Meeting (IEDM), 4 pages.

* cited by examiner

ARTIFICIAL NEUROMORPHIC CIRCUIT AND OPERATION METHOD

RELATED APPLICATIONS

This application is a U.S. National Phase application of PCT/CN2019/118793 filed Nov. 15, 2019, which is herein incorporated by reference.

BACKGROUND

Field of Invention

The present disclosure relates to a circuit technology. More particularly, the present disclosure relates to an artificial neuromorphic circuit and an operation method.

Description of Related Art

A living body has a neural network system. The neural network system contains many neurons. Neurons were proposed by Heinrich Wilhelm Gottfried von Waldeyer-Hartz in 1891. Neurons are processing units that obtain discrete information from the brain. In 1897, Charles Sherrington called the junction between two neurons a "synapse." The discrete information from the brain flows through the synapse along one direction, and the neurons are divided into a "presynaptic neuron" and a "postsynaptic neuron" according to this direction. A neuron emits a "spike" when receiving enough input and being activated.

Theoretically, the captured experience is translated into synaptic conductance in the brain. The synaptic conductance changes over time based on the relative spike times of the presynaptic neuron and the postsynaptic neuron. If the postsynaptic neuron fires before the presynaptic neuron fires, the synaptic conductance will increase. If the two fire in reverse order, the synaptic conductance will decrease. In addition, this change depends on the delay between the two events. The longer the delay, the smaller the change is.

An artificial neural network allows an electronic system to operate in a manner similar to a biological brain. A neuron system may include various electronic circuits that model biological neurons.

A neural network system affects the perception, selection, decision, or various other behaviors of the living body, so the neural network system plays a very important role in the living body. If circuits can be utilized to build neural network systems similar to those in the living bodies, they will have key influences on many areas.

For example, U.S. Pat. No. 9,830,981 or Chinese Patent No. 107111783 mentions that a phase change element and some other elements can be utilized to construct an artificial neural network system.

SUMMARY

An artificial neuromorphic circuit is provided. The artificial neuromorphic circuit comprises a synapse circuit and a post-neuron circuit. The synapse circuit comprises a phase change element, and is configured to receive a first pulse signal and a second pulse signal. The post-neuron circuit is coupled to the synapse circuit. The post-neuron circuit comprises an input terminal, an output terminal, and an integration terminal. The integration terminal is charged to a membrane potential according to the first pulse signal. The post-neuron circuit further comprises a first control circuit, a second control circuit, a first delay circuit, and a second delay circuit. The first control circuit is coupled between the integration terminal and the output terminal. The first control circuit is configured to generate a firing signal at the output terminal based on the membrane potential. The second control circuit is coupled to the output terminal and is configured to generate a first control signal based on the firing signal. The first delay circuit is configured to delay the firing signal to generate a second control signal. The second delay circuit is configured to delay the second control signal to generate a third control signal. The first control signal and the third control signal are configured to control a voltage level of the integration terminal, maintain the integration terminal at a fixed voltage during a period, and the second control signal is configured to cooperate with the second pulse signal to control a state of the phase change element so as to determine a weight of the artificial neuromorphic circuit.

In some embodiments, the artificial neuromorphic circuit further comprises a pre-neuron circuit. The pre-neuron circuit is coupled to the synapse circuit. The pre-neuron circuit is configured to generate the first pulse signal and the second pulse signal, and transmit the first pulse signal and the second pulse signal to the synapse circuit.

In some embodiments, the first control circuit comprises a comparator and a wave shaping circuit. The comparator is configured to compare the membrane potential and a threshold voltage to generate a comparison signal. The wave shaping circuit is configured to generate the firing signal based on the comparison signal.

In some embodiments, the post-neuron circuit further comprises a first switch. The first switch is coupled among the second control circuit, a power voltage, and the integration terminal. The first switch is controlled by the first control signal.

In some embodiments, the post-neuron circuit further comprises a second switch and a third switch. The second switch is coupled between the integration terminal and a ground terminal. The third switch is coupled between the output terminal and the ground terminal. The second switch and the third switch are controlled by the third control signal.

In some embodiments, the second control circuit comprises an inverter. The inverter is configured to receive the firing signal so as to generate the first control signal.

In some embodiments, the second control circuit comprises a filter circuit. The filter circuit is configured to receive the firing signal so as to generate the first control signal.

In some embodiments, the second control circuit comprises an inverter and a filter circuit. The inverter is configured to receive the firing signal so as to generate an inverted signal. The filter circuit is configured to generate the first control signal based on the inverted signal.

In some embodiments, the synapse circuit further comprises an axon pulse switch and an axon plastic switch. A first terminal of the axon pulse switch is configured to receive the first pulse signal. A first terminal of the axon plastic switch is configured to receive the second pulse signal. A second terminal of the axon pulse switch and a second terminal of the axon plastic switch are coupled to the phase change element. The phase change element is coupled to the post-neuron circuit.

The present disclosure provides an operation method of an artificial neuromorphic circuit. The operation method comprises: receiving a first pulse signal and a second pulse signal by using a synapse circuit; generating a firing signal based on the first pulse signal, and generating a first control signal based on the firing signal by using a post-neuron circuit, wherein the first control signal is configured to control a voltage level of an integration terminal of the post-neuron circuit; delaying the firing signal to generate a second control signal by using the post-neuron circuit; and delaying the second control signal to generate a third control signal by using the post-neuron circuit. The third control signal is configured to control the voltage level of the integration terminal of the post-neuron circuit. The second control signal is configured to cooperate with the second pulse signal to control a state of the phase change element so as to determine a weight of the artificial neuromorphic circuit.

In some embodiments, the post-neuron circuit comprises a first control circuit, and generating the firing signal comprises: comparing the voltage level of the integration terminal and a threshold voltage by using a comparator of the first control circuit to generate a comparison signal; and generating the firing signal based on the comparison signal by using a wave shaping circuit of the first control circuit.

In some embodiments, the post-neuron circuit comprises a second control circuit. The operation method further comprises: generating the first control signal based on the firing signal by using the second control circuit; and controlling a switch of the post-neuron circuit according to the first control signal.

In some embodiments, generating the first control signal comprises: receiving the firing signal by using a filter circuit of the second control circuit to generate the first control signal.

In some embodiments, generating the first control signal comprises: receiving the firing signal by using an inverter of the second control circuit to generate the first control signal.

In some embodiments, generating the first control signal comprises: receiving the firing signal by using an inverter of the second control circuit; and generating the first control signal based on the firing signal that is inverted by using a filter circuit of the second control circuit.

In some embodiments, generating the second control signal and the third control signal comprises: delaying the firing signal by using a first delay circuit of the post-neuron circuit to generate the second control signal; and delaying the second control signal by using a second delay circuit of the post-neuron circuit to generate the third control signal.

In summary, the artificial neuromorphic circuit and operation method of the present disclosure can utilize circuits to build an artificial neural network system.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

In this document, the term "coupled" may also be termed "electrically coupled," and the term "connected" may be termed "electrically connected." "Coupled" and "connected" may also be used to indicate that two or more elements cooperate or interact with each other.

Figure 1:
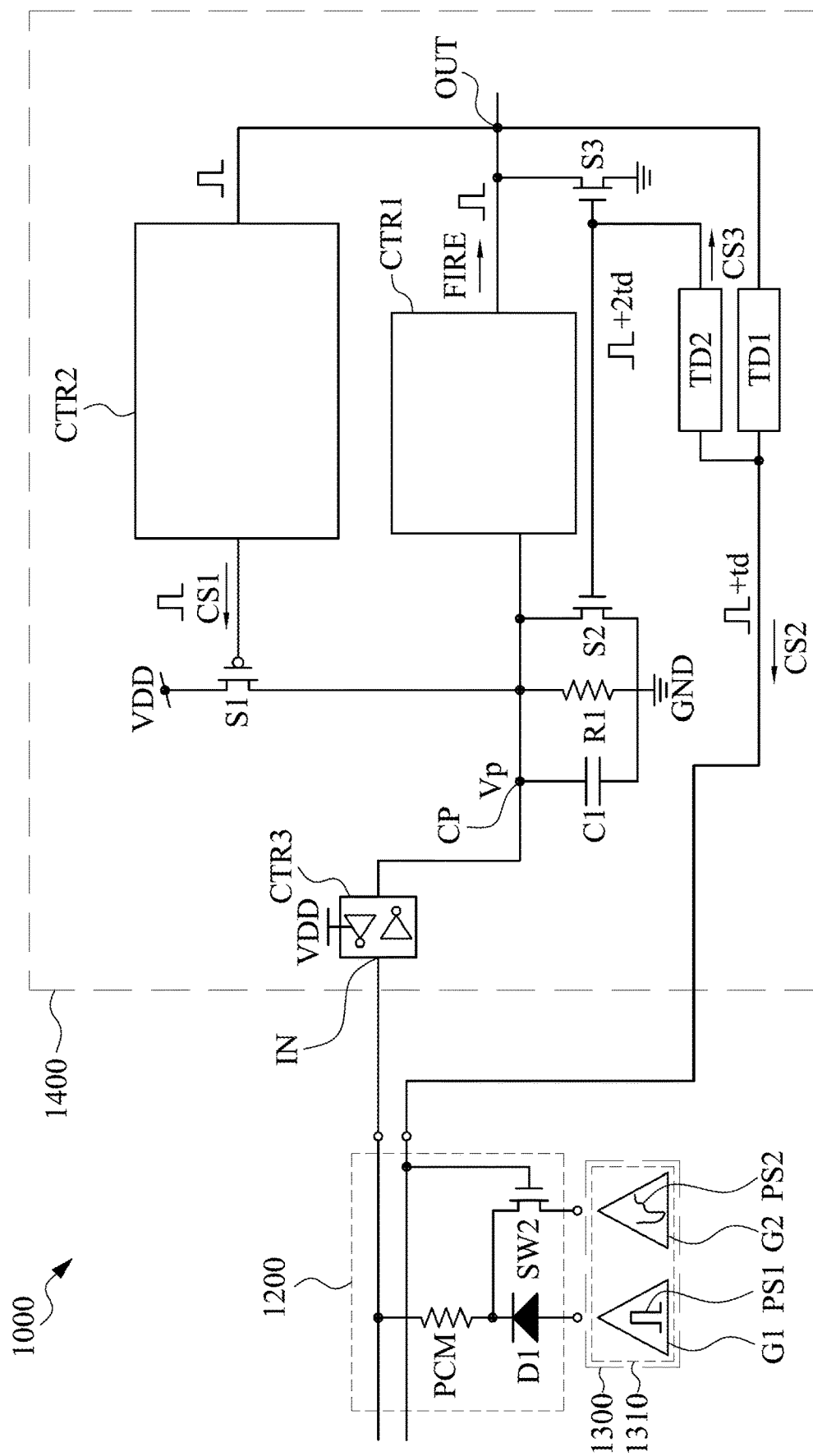
FIG. 1 depicts a schematic diagram of an artificial neuromorphic circuit according to some embodiments of the present disclosure.

A description is provided with reference to FIG. 1. FIG. 1 depicts a schematic diagram of an artificial neuromorphic circuit 1000 according to some embodiments of the present disclosure.

As for the example shown in FIG. 1, the artificial neuromorphic circuit 1000 includes a synapse circuit 1200, a pre-synaptic neuron circuit 1300 (hereinafter referred to as "pre-neuron" 130), and a post-synaptic neuron circuit 1400 (hereinafter referred to as "post-neuron" 1400). The pre-neuron 1300 includes an axon driver 1310. The axon driver 1310 includes a pulse generator G1 and a pulse generator G2. The post-neuron 1400 includes dendrites and is configured to receive a signal. In some embodiments, the axon driver 1310 of the pre-neuron 1300 sends a spike, which is transmitted to the dendrites of the post-neuron 1400 via the synapse circuit 1200 to stimulate the post-neuron 1400. In this manner, an effect similar to signal transmission in the neural network system can be achieved.

The synapse circuit 1200 includes a phase change element PCM, a switch (axon pulse switch) D1, and a switch (axon plastic switch) SW2. The phase change element PCM includes a phase change material. The phase change material has different phases according to a magnitude of a current. Information can be stored in the phase correspondingly. For example, when the phase change element PCM is in a crystalline phase or a polycrystalline phase, its resistance value is lower. When the phase change element PCM is in an amorphous phase, its resistance value is higher. The phase change element PCM can store logic 1 or 0 according to a magnitude of the resistance value of the phase change element PCM.

The switch D1 is implemented by using a diode, and the switch SW2 is implemented by using a transistor. In some other embodiments, the switch D1 may also be implemented by using a transistor. The switch D1 includes a first terminal and a second terminal. The first terminal is an anode terminal and the second terminal is a cathode terminal. The first terminal of the switch D1 is coupled to the pulse generator G1 to receive a pulse signal PS1. A first terminal of the switch SW2 is coupled to the pulse generator G2 to receive a pulse signal PS2. The second terminal of the switch D1 and a second terminal of the switch SW2 are coupled to a first terminal of the phase change element PCM. A second terminal of the phase change element PCM is coupled to the post-neuron 1400. A control terminal of the switch SW2 is coupled to the post-neuron 1400 so as to receive a control signal CS2 from the post-neuron 1400.

The post-neuron 1400 includes an input terminal, an integration terminal CP, an output terminal OUT, a capacitor C1, a resistor R1, control circuits CTR1-CTR3, delay circuits TD1-TD2, and switches S1-S3. A first terminal of the capacitor C1, a first terminal of the resistor R1, and a first terminal of the switch S2 are coupled to a ground terminal GND. The second terminal of the phase change element PCM, a second terminal of the capacitor C1, a second terminal of the resistor R1, and a second terminal of the switch S2 are coupled to the integration terminal CP. The control circuit CTR1 is coupled between the integration terminal CP and the output terminal OUT. The control circuit CTR2 is coupled between the output terminal OUT and the switch S1. The control circuit CTR3 is coupled between the input terminal IN and the integration terminal CP. The switch S1 is coupled among the control circuit CTR2, a power voltage VDD, and the integration terminal CP. The delay circuit TD1 is coupled between the output terminal OUT and the control terminal of the switch SW2. The delay circuit TD2 is coupled between an output terminal of the delay circuit TD1 and control terminals of the switch S2 and the switch S3. The switch S3 is coupled between the output terminal OUT and the ground terminal GND.

The capacitor C1 in the post-neuron 1400 simulates an electrical potential of a neuron membrane. There are a variety of charged ions inside and outside the neuron membrane. Due to the differences in the type and charge quantity of the charged ions inside and outside the cell membrane, the capacitor C1 reflects a voltage difference Vp (also called membrane potential Vp) inside and outside the cell membrane. The neuron membrane has channels that are of different sizes and can control the passage of the charged ions. The charged ions inside and outside the cell membrane can pass these channels to cause a change of the membrane potential Vp. The resistor R1 simulates the electrical effect of the passage of charged ions back and forth through the channels. The membrane potential Vp of the post-synaptic neuron membrane is changed after the pulse signal sent by the axon of the pre-synaptic neuron is received by the dendrites of the post-synaptic neuron. The behavioral effect corresponding to the post-neuron 1400 is to charge the capacitor C1.

If an intensity of the above pulse signal is strong enough, the post-neuron 1400 will output a firing signal (FIRE) when the membrane potential Vp of the capacitor C1 exceeds a threshold voltage $V_{th}$. On the contrary, if the intensity of the pulse signal is not strong enough, the post-neuron 1400 will not output the firing signal (FIRE) although a voltage on the capacitor C1 rises but, however, does not exceed the threshold voltage $V_{th}$. In addition, the increased membrane potential Vp will gradually decrease through a leakage of the resistor R1. The behavior on the neuron is that the post-neuron instantly changes the concentrations of charged ions inside and outside the cell membrane due to the firing signal of the pre-neuron, and then the charged ions are balanced by diffusion through the channels on the cell membrane, so that the membrane potential Vp of the post-neuron membrane returns to equilibrium. Accordingly, the electrical behavior of the path that the pre-neuron sends the pulse signal to the capacitor C1 of the post-neuron is called leaky integration and fire (LIF). The membrane potential Vp of the neuron is a function of LIF (Vp=F (LIF)).

The firing signal of the pre-neuron affects the membrane potential Vp of the post-neuron 1400 via the synapse (including the axon of the pre-neuron and the dendrites of the post-neuron). However, even with the same firing signal, different pre-neurons have different magnitudes of effects on the membrane potential Vp of the post-neuron 1400. It can be said that a magnitude of a synaptic weight (W) between the pre-neuron and the post-neuron is different. Synaptic weight (W) is plastic (or called adaptable), and a magnitude of weight change (ΔW) is a function of a time difference between the pre-neuron firing time ($t_{pre}$) and the post-neuron firing time ($t_{post}$): ΔW=F($t_{post}$-$t_{pre}$). In other words, the magnitude of the change of the synaptic weight (ΔW) is related to the time difference between the time point $t_{pre}$ and the time point $t_{post}$, and the synaptic weight W is adaptively adjusted according to the value of the time difference. Therefore, the synaptic weight W relates to the index of causality between neurons. In this manner, a characteristic index representing that the synapse changes the weight (W) due to the relative relationship between the pre-neuron firing time and the post-neuron firing time is defined, which is called spike timing dependent plasticity (STDP). The STDP of the synapse is also indirectly related to LIF. This is because LIF can determine the post-neuron firing time ($t_{post}$). In one embodiment, the STDP of the synapse represents the plasticity of the conductivity of synaptic current. In greater detail, the STDP of the synapse represents a magnitude of a synaptic resistance in some embodiments.

Figure 2A:
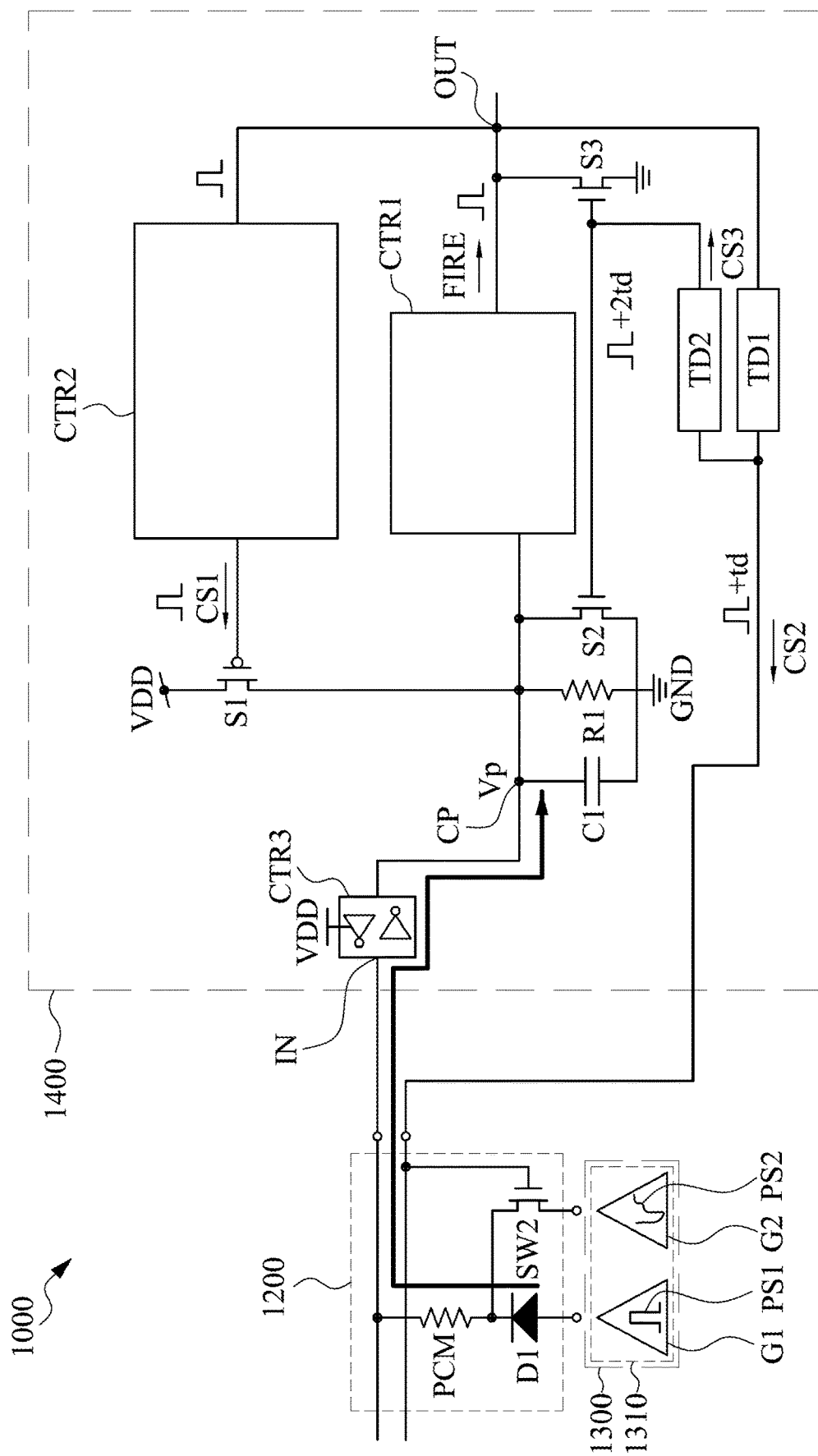
FIG. 2A depicts a schematic diagram of an artificial neuromorphic circuit according to some embodiments of the present disclosure.
Figure 3A:
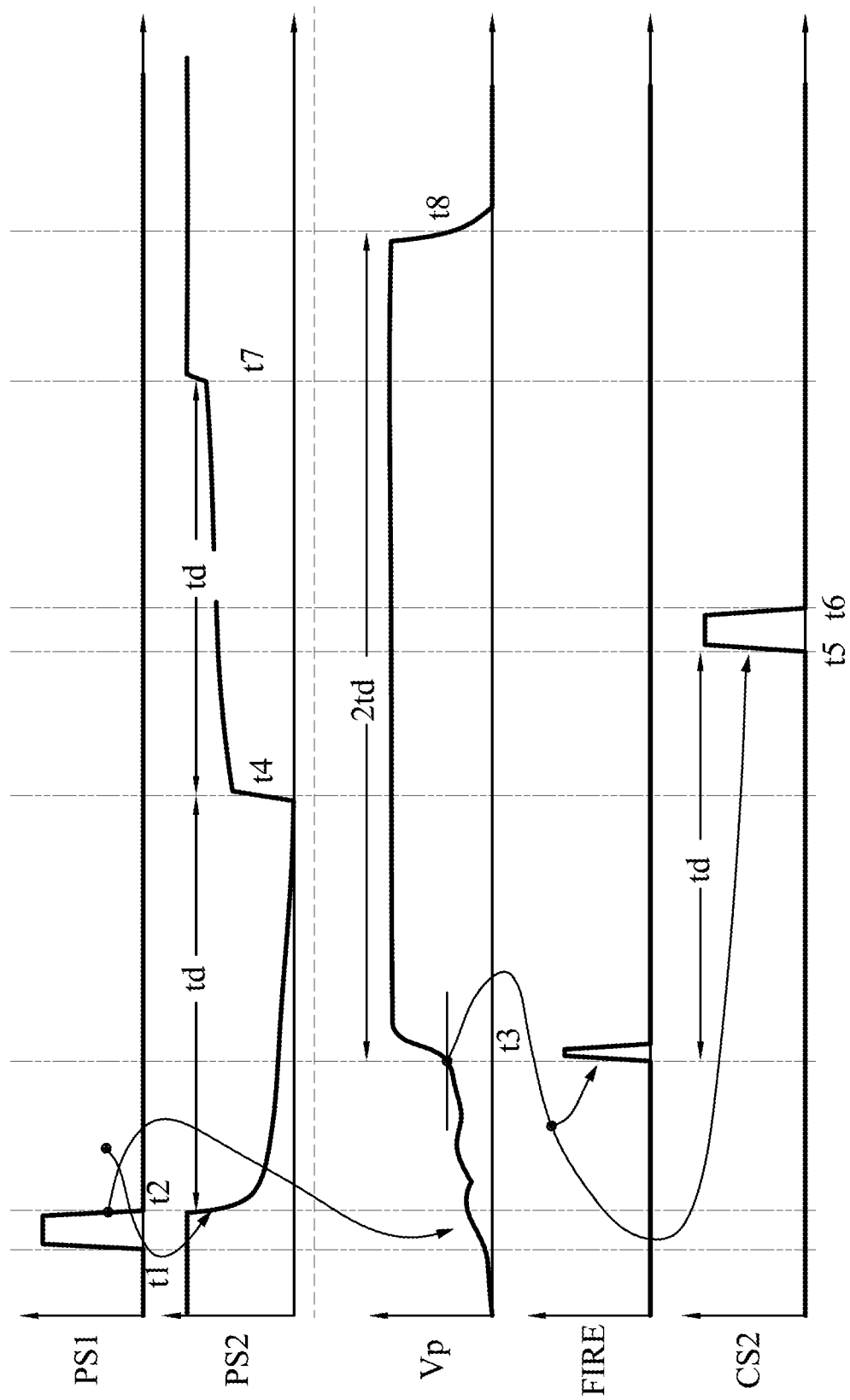
FIG. 3A depicts a timing diagram of long term potentiation of a synapse circuit of an artificial neuromorphic circuit according to some embodiments of the present disclosure.

A description is provided with reference to FIG. 2A and FIG. 3A. FIG. 3A depicts a timing diagram of long term potentiation of the synapse circuit 1200 of the artificial neuromorphic circuit 1000 according to some embodiments of the present disclosure. As for the operation, the pre-neuron 1300 sends the spike to the post-neuron 1400. The pulse generator G1 will send the pulse signal PS1. A pulse time period of the pulse signal PS1 is from time t1 to time t2. In some embodiments, the pulse signal PS1 is also called "axon pulse LIF", and its pulse width is 0.1 milliseconds (ms). However, the present disclosure is not limited in this regard. In an initial state, the switch S1 of the post-neuron 1400 is in a turn-off state, and the integration terminal CP is in a floating state. During the pulse time duration of the pulse signal PS1, the switch D1 is turned on. The pulse signal PS1 charges the integration terminal CP via the switch D1, the phase change element PCM, and the control circuit CTR3 so as to form a voltage level (membrane potential) Vp at the integration terminal CP. After the pulse signal PS1 ends, the control circuit CTR3 will cut off the electrical path of the post-neuron 1400 and the synapse circuit 1200. At time t2, the pre-neuron 1300 sends the pulse signal PS2. A pulse time period of the pulse signal PS2 is from time t2 to time t7. In some embodiments, the pulse signal PS2 is also called "axon pulse STDP". The pulse time period of the pulse signal PS2 is divided into two time zones with equal time, former and latter. The pulse in the former time zone (td) is gradually decreased from a high voltage. The pulse in the latter time zone (td) is instantly increased by a voltage value (not marked), and is then gradually increased. In some embodiments, a duration of the pulse signal PS2 (2td) is 100 ms.

At the same time, owing to the interaction effect of charging the capacitor C1 and discharging the resistor R1 by the pulse signal PS1 (axon pulse LIF) of another pre-neuron (not shown in the figure), the membrane potential Vp of post-neuron 1400 oscillates but keeps rising. When the membrane potential Vp reaches the threshold voltage $V_{th}$ at time t3, the control circuit CTR1 generates the firing signal FIRE at the output terminal OUT. In some embodiments, the above firing signal FIRE is also called "post-synaptic neuron axon spike". The above firing signal FIRE immediately generates a control signal CS1 through the control circuit CTR2 to turn on the switch S1 so that the power voltage VDD charges the membrane potential Vp to the power voltage VDD. The firing signal FIRE is delayed by the delay circuit TD1 and the delay circuit TD2 to generate a control signal CS3 so as to turn on the switch S2 and the switch S3. At this time, a voltage of the membrane potential Vp is decreased to a ground value (the ground terminal GND) at time t8. In some embodiments, a delay time of both the delay circuit TD1 and the delay circuit TD2 is td, the voltage of the membrane potential Vp is therefore maintained at the power voltage VDD for a period of 2td (time t3 to time t8). During this period (2td), the post-neuron 1400 is unable to receive firing signals of any other neurons.

Figure 2B:
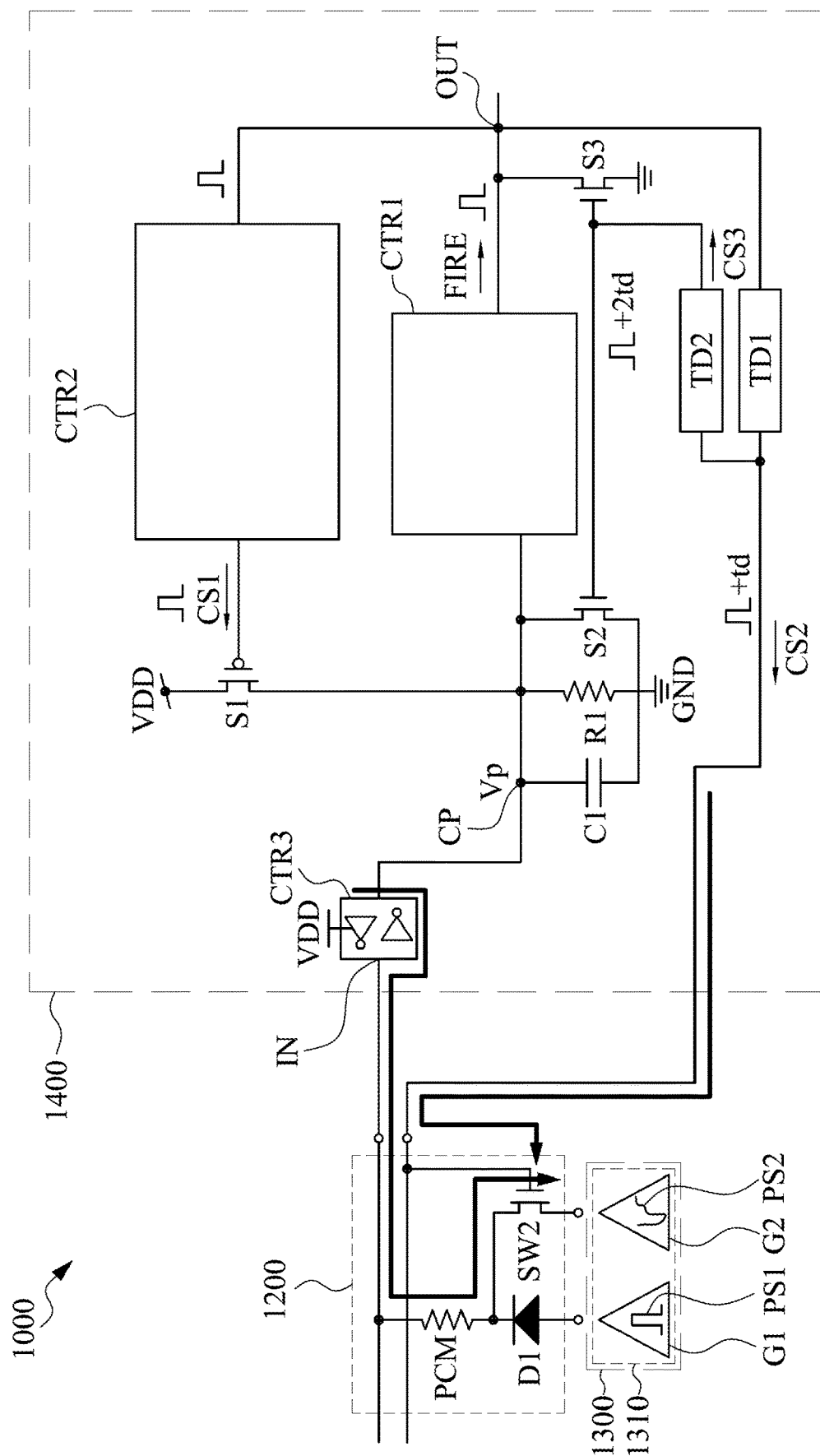
FIG. 2B depicts a schematic diagram of an artificial neuromorphic circuit according to some embodiments of the present disclosure.

Then, a description is provided with reference to FIG. 2B and FIG. 3A. FIG. 3A depicts a timing diagram of long term potentiation of the synapse circuit 1200 of the artificial neuromorphic circuit 1000 according to some embodiments of the present disclosure. When the control circuit CTR1 generates the firing signal FIRE at the output terminal OUT, the firing signal FIRE generates the control signal CS2 through the delay circuit TD1. A pulse time of the control signal CS2 is from time t5 to time t6. In some embodiments, the above control signal CS2 is also called "post-synaptic neuron STDP trigger", and its pulse time is 0.1 ms. The control signal CS2 controls a gate of the switch SW2 in the synapse circuit 1200 to turn on the switch SW2.

During the pulse time of the control signal CS2, a current flowing through the phase change element PCM in the synapse circuit 1200 is determined by a cooperative effect of the pulse signal PS2 (the axon pulse STDP) and the control signal CS2 (the post-synaptic neuron STDP trigger). In other words, the pulse signal PS2 (the axon pulse STDP) and the control signal CS2 (the post-synaptic neuron STDP trigger) can determine a magnitude of the current flowing through the phase change element PCM. In greater detail, during the pulse time duration of the pulse signal PS2 (the axon pulse STDP), the control circuit CTR3 has a circuit path connected to the power voltage VDD, and the second terminal of the phase change element PCM is coupled to the power voltage VDD. At this time, the switch D1 is not turned on, so that the current can only flow through the switch SW2. When the switch SW2 is turned on, the first terminal of the switch SW2 receives the pulse signal PS2 (the axon pulse STDP).

A description is provided with reference to FIG. 3A. The pulse time duration (time t5 to time t6) of the control signal CS2 (the post-synaptic neuron STDP trigger) falls into the latter time zone of the pulse signal PS2 (the axon pulse STDP). Hence, a voltage difference across the first terminal and the second terminal of the switch SW2 is smaller. Accordingly, a smaller current flows through the switch SW2 instantaneously. That is, the current that instantaneously flows through the phase change element PCM is smaller. As a result, the phase change element PCM has a lower resistance value. In other words, the synapse circuit 1200 has better conductivity, so it is called synapse long term potentiation. This also indicates that the firing of the post-neuron 1400 (the firing signal FIRE) is related to the pulse signal PS1 (the axon pulse LIF) of the pre-neuron 1300. That is to say, the firing of the post-neuron 1400 (the firing signal FIRE) is causally related to the firing of the pre-neuron 1300. Therefore, the weight W of the synaptic circuit 1200 connected between the two neurons is increased.

Figure 3B:
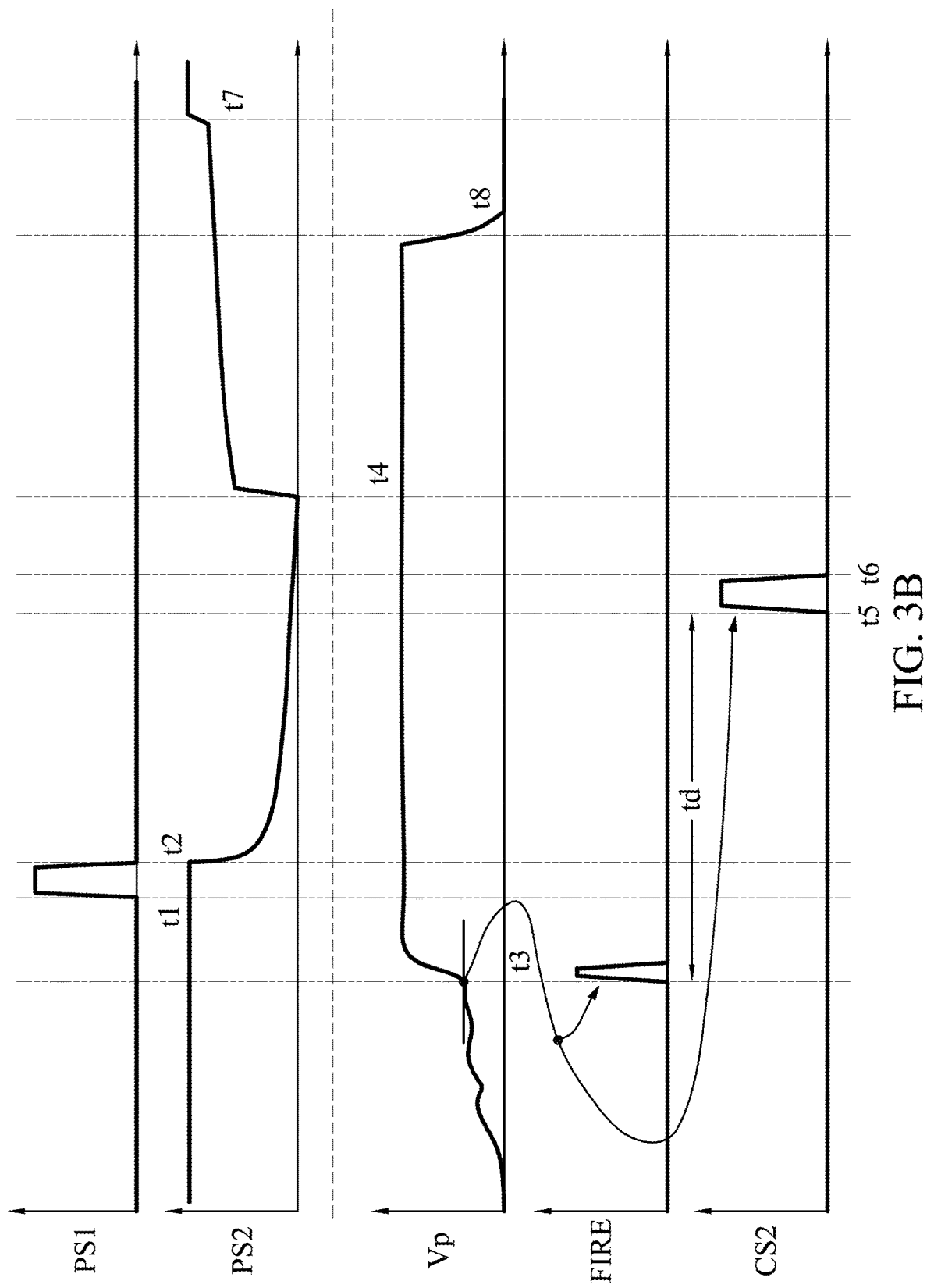
FIG. 3B depicts a timing diagram of long term depression of a synapse circuit of an artificial neuromorphic circuit according to some embodiments of the present disclosure.

On the contrary, a description is provided with reference to FIG. 2A, FIG. 2B, and FIG. 3B. FIG. 3B depicts a timing diagram of long term depression of the synapse circuit 1200 of the artificial neuromorphic circuit 1000 according to some embodiments of the present disclosure. Since the operating principle described below is similar to the above, only the differences are explained as follows. A description is first provided with reference to FIG. 3B. The pulse time (time t5 to time t6) of the control signal CS2 (the post-synaptic neuron STDP trigger) falls into the former time zone of the pulse signal PS2 (the axon pulse STDP). Hence, the voltage difference across the first terminal and the second terminal of the switch SW2 is larger. Accordingly, a larger current flows through the switch SW2 instantaneously. That is, the current that instantaneously flows through the phase change element PCM is larger. As a result, the phase change element PCM has a higher resistance value. In other words, the synapse circuit 1200 has poorer conductivity, so it is called synapse long term depression. As can be seen from FIG. 3B, the firing of the post-neuron 1400 (the firing signal FIRE) is not caused by the pulse signal PS1 (the axon pulse LIF) of the pre-neuron 1300. That is to say, the firing of the post-neuron 1400 (the firing signal FIRE) does not have a causal relationship with the firing of the pre-neuron 1300. Therefore, the weight W of the synaptic circuit 1200 connected between the two neurons is decreased. The artificial neuromorphic circuit 1000 can utilize the above operations to learn behaviors so as to realize the neural network system similar to that in a living body.

Figure 4:
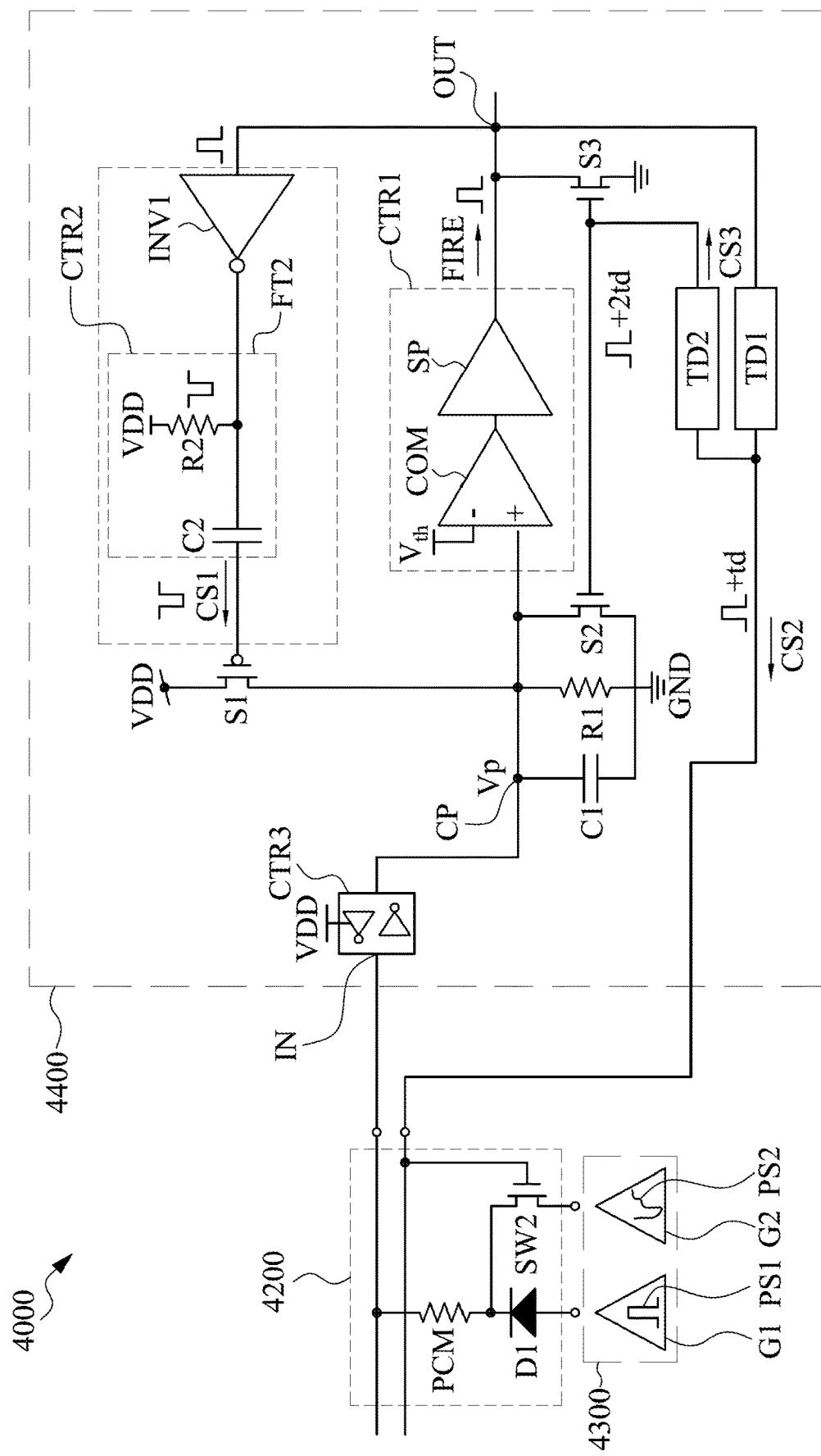
FIG. 4 depicts a schematic diagram of an artificial neuromorphic circuit according to some embodiments of the present disclosure.

A description is provided with reference to FIG. 4. FIG. 4 depicts a schematic diagram of an artificial neuromorphic circuit 4000 according to some embodiments of the present disclosure. The artificial neuromorphic circuit 4000 includes a pre-neuron 4300, a synapse circuit 4200, and a post-neuron 4400. In the following, only the main differences between the artificial neuromorphic circuit 4000 of FIG. 4 and the artificial neuromorphic circuit 1000 of FIG. 1 are provided.

Take the example shown in FIG. 4 as an example. As mentioned previously, the control circuit CTR1 can be implemented by using a comparator COM and a wave shaping circuit SP. The comparator COM compares the voltage level of the integration terminal CP with the threshold voltage $V_{th}$ to generate a comparison signal. When the membrane potential Vp is lower than the threshold voltage $V_{th}$, the comparison signal has a low voltage level. When the membrane potential Vp is higher than the threshold voltage $V_{th}$, the comparison signal has a high voltage level. The wave shaping circuit SP generates the firing signal FIRE based on the comparison signal.

In addition to that, the control circuit CTR2 can be implemented by using an inverter INV1. Take the example shown in FIG. 4 as an example, the control circuit CTR2 further includes a filter circuit FT2. The filter circuit FT2 includes a capacitor C2 and a resistor R2. The inverter INV1 receives the firing signal FIRE to generate a signal that is inverted. The filter circuit FT2 filters the signal that is inverted from the inverter INV1 to generate the control signal CS1. In the present embodiment, the switch S1 is a P-type metal-oxide-semiconductor (PMOS) field effect transistor. In an initial state, a gate terminal of the switch S1 is coupled to the power voltage VDD, the switch S1 is turned off, and the integration terminal CP is in the floating state. When the control circuit CTR1 sends a positive phase firing signal FIRE, the inverter INV1 inverts the firing signal FIRE. The filter circuit FT2 is a high pass filter, so that a control terminal of the switch S1 is pulled to a low voltage instantaneously, and the switch S1 is turned on to pull a voltage of the integration terminal CP to the power voltage VDD. A time constant (τ) of the filter circuit FT2 is appropriately designed so that a voltage at the control terminal of the switch S1 rises slowly. The switch S1 can be turned off at approximately twice the td time. Since the connection relationships and operations of the other components of the artificial neuromorphic circuit 4000 are similar to those of the artificial neuromorphic circuit 1000 of FIG. 1, a description in this regard is not provided.

Figure 5:
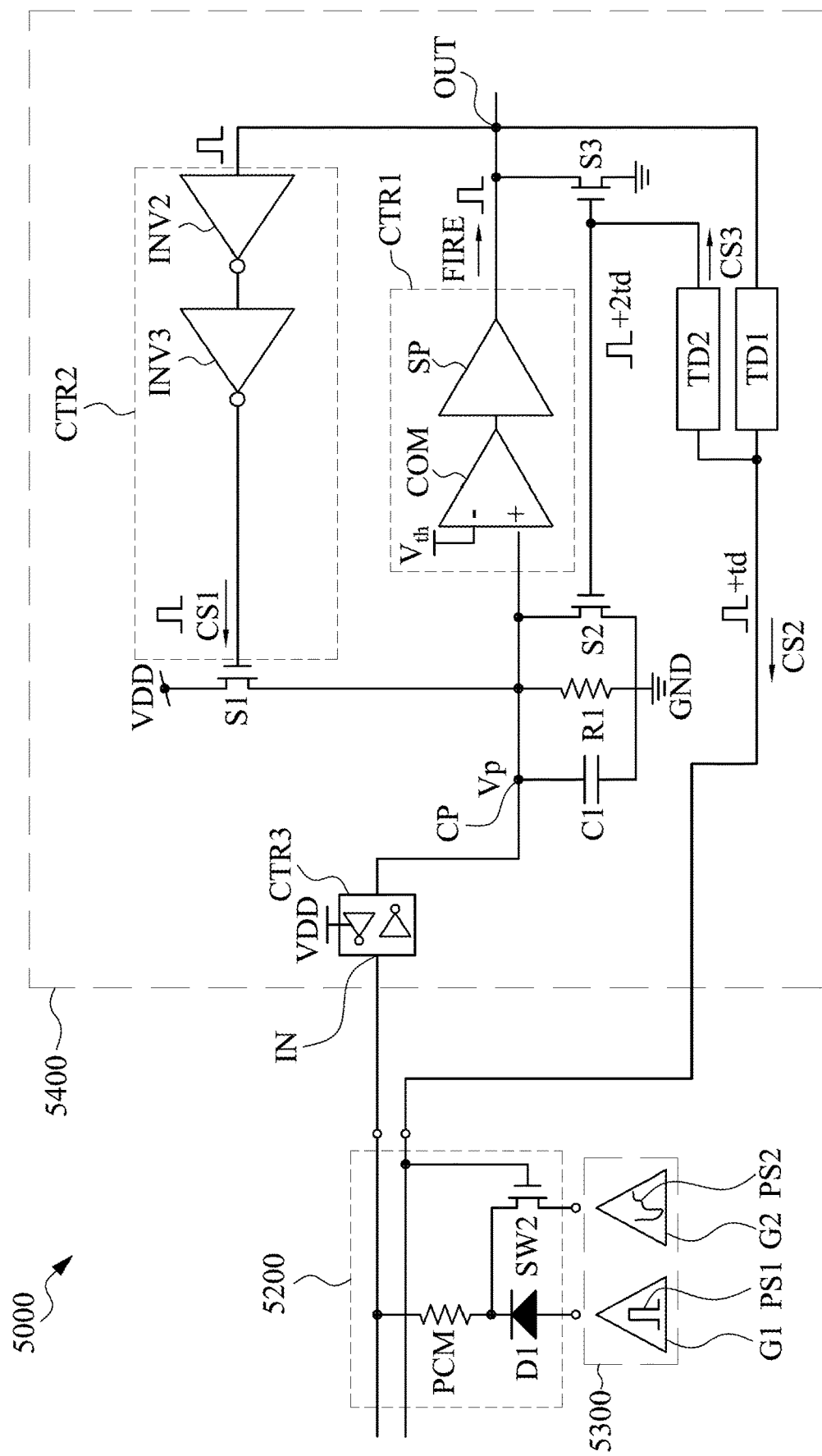
FIG. 5 depicts a schematic diagram of an artificial neuromorphic circuit according to some embodiments of the present disclosure.

A description is provided with reference to FIG. 5. FIG. 5 depicts a schematic diagram of an artificial neuromorphic circuit 5000 according to some embodiments of the present disclosure. The artificial neuromorphic circuit 5000 includes a pre-neuron 5300, a synapse circuit 5200, and a post-neuron 5400. In the following, only the main differences between the artificial neuromorphic circuit 5000 of FIG. 5 and the artificial neuromorphic circuit 1000 of FIG. 1 are provided.

Take the example shown in FIG. 5 as an example. The control circuit CTR2 includes an inverter INV2 and an inverter INV3. The inverter INV2 receives the firing signal FIRE to generate an inverted signal. The inverter INV3 receives the inverted signal to generate the control signal CS1. In the present embodiment, when the firing signal FIRE has a high voltage level, the control signal CS1 has the high voltage level. The switch S1 is an N-type transistor and the switch S1 is turned on according to the control signal CS1 having the high voltage level, thus controlling (maintaining) the voltage level of the integration terminal CP. In the present embodiment, the switch S1 is an N-type metal-oxide-semiconductor (NMOS) field effect transistor. In an initial state, a gate terminal of the switch S1 is connected to the ground terminal GND, the switch S1 is turned off, and the integration terminal CP is in the floating state. When the control circuit CTR1 sends a positive phase firing signal FIRE, the inverter INV2 and the inverter INV3 cooperatively pull a control terminal of the switch S1 to a high voltage. The switch S1 is turned on to pull a voltage of the integration terminal CP to the power voltage VDD. After the firing signal FIRE ends, the switch S1 is turned off and the integration terminal CP is in the floating state.

Since the connection relationships and operations of the other components of the artificial neuromorphic circuit 5000 are similar to those of the artificial neuromorphic circuit 1000 of FIG. 1, a description in this regard is not provided.

Figure 6:
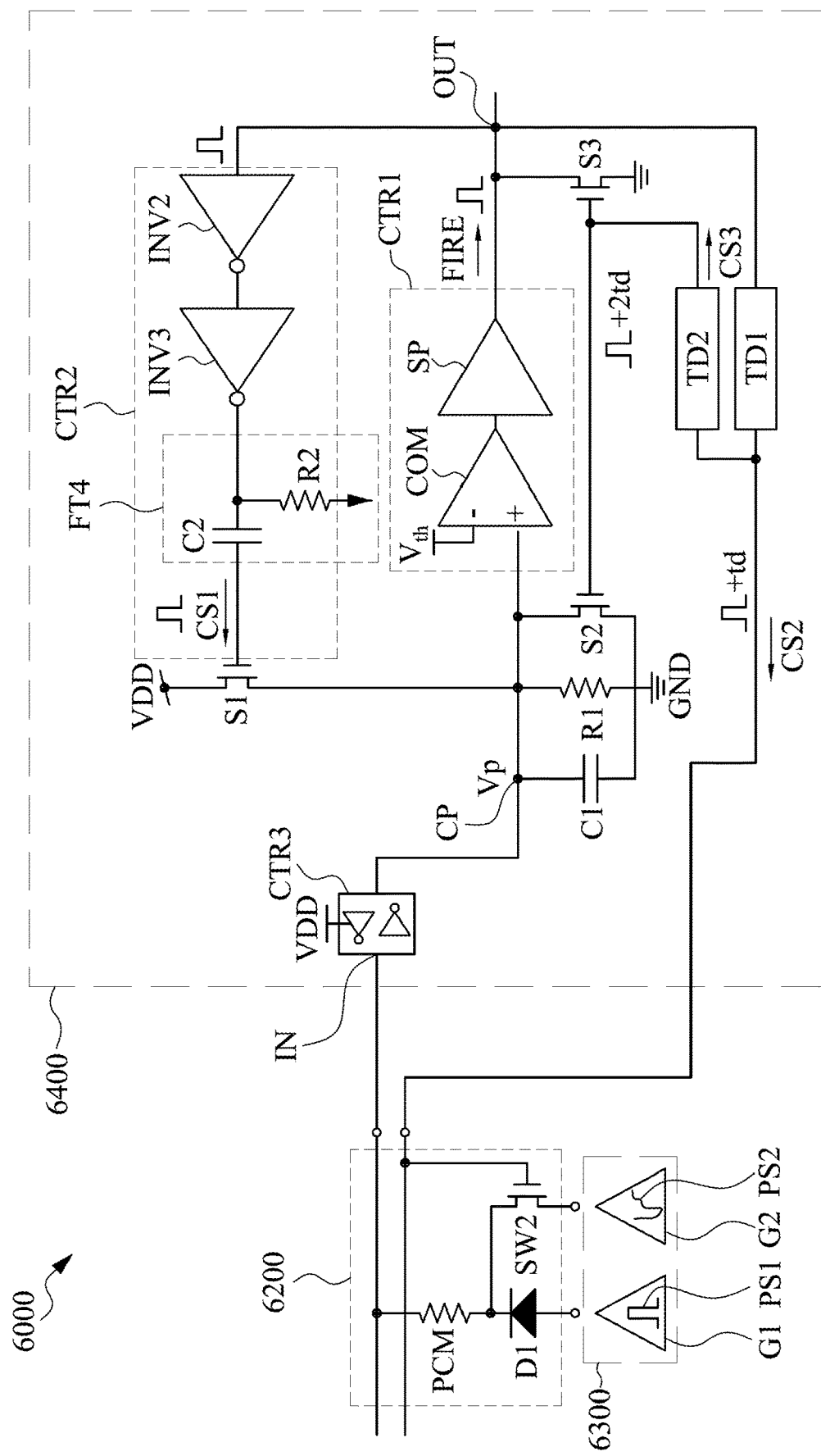
FIG. 6 depicts a schematic diagram of an artificial neuromorphic circuit according to some embodiments of the present disclosure.

A description is provided with reference to FIG. 6. FIG. 6 depicts a schematic diagram of an artificial neuromorphic circuit 6000 according to some embodiments of the present disclosure. The artificial neuromorphic circuit 6000 includes a pre-neuron 6300, a synapse circuit 6200, and a post-neuron 6400. In the following, only the main differences between the artificial neuromorphic circuit 6000 of FIG. 6 and the artificial neuromorphic circuit 5000 of FIG. 5 are provided.

Take the example shown in FIG. 6 as an example. The control circuit CTR2 further includes a filter circuit FT4. The filter circuit FT4 filters an output of the inverter INV3 to generate the control signal CS1. When the control circuit CTR1 sends a positive phase firing signal FIRE, a control terminal of the switch S1 is pulled to a high voltage instantaneously because the filter circuit FT4 is a high pass filter. The switch S1 is turned on to pull a voltage of the integration terminal CP to the power voltage VDD. A time constant (τ) of the filter circuit FT4 is appropriately designed so that a voltage at the control terminal of the switch S1 is slowly reduced. The switch S1 can be turned off at approximately twice the td time.

Since the connection relationships and operations of the other components of the artificial neuromorphic circuit 6000 are similar to those of the artificial neuromorphic circuit 5000 of FIG. 5, a description in this regard is not provided.

Figure 7:
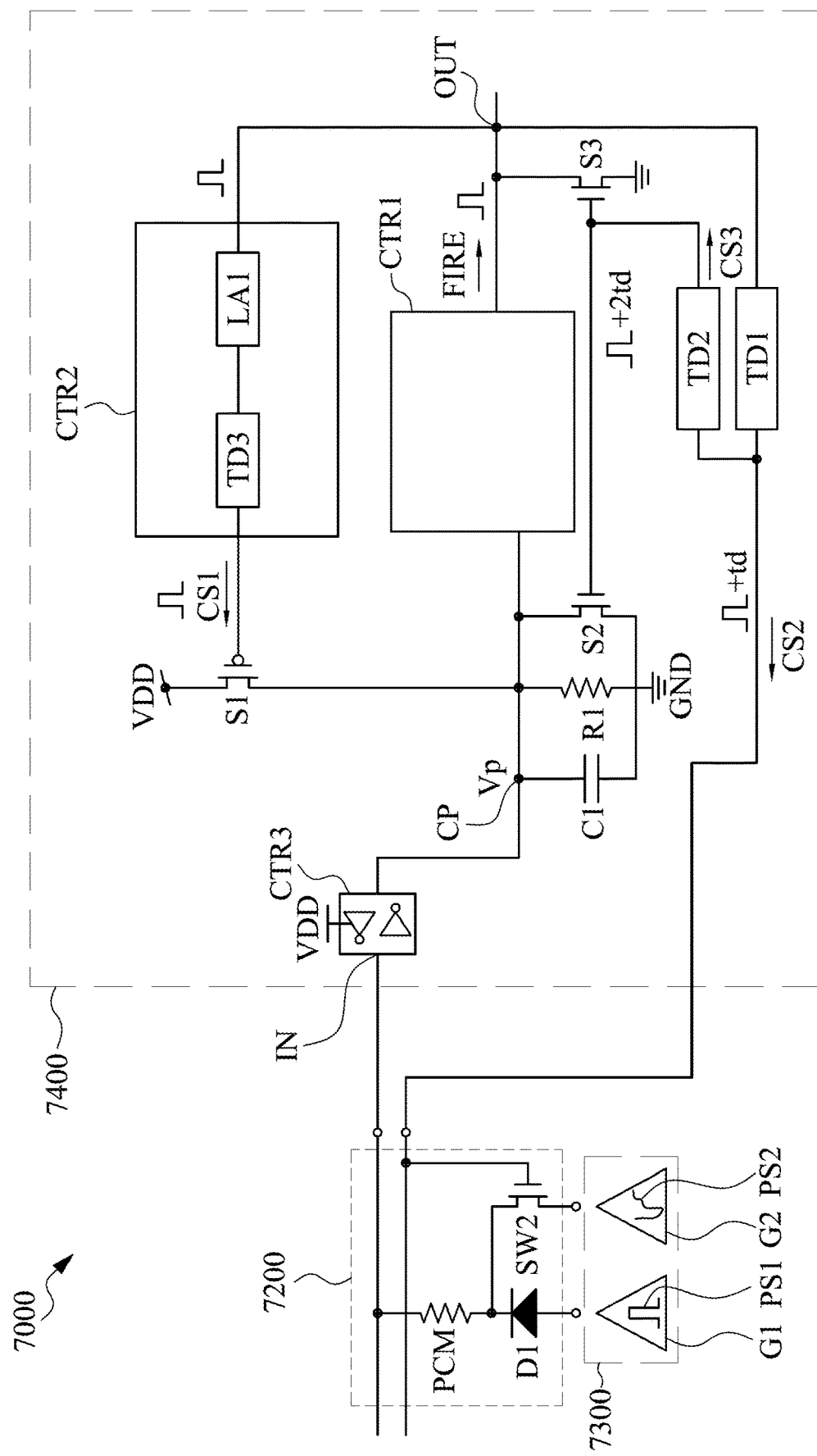
FIG. 7 depicts a schematic diagram of an artificial neuromorphic circuit according to some embodiments of the present disclosure.

A description is provided with reference to FIG. 7. FIG. 7 depicts a schematic diagram of an artificial neuromorphic circuit 7000 according to some embodiments of the present disclosure. The artificial neuromorphic circuit 7000 includes a synapse circuit 7200 and a post-neuron 7400. In the following, only the main differences between the artificial neuromorphic circuit 7000 of FIG. 7 and the artificial neuromorphic circuit 1000 of FIG. 1 are provided.

Take the example shown in FIG. 7 as an example. The control circuit CTR2 can be implemented by using a level latch LA1 and a delay circuit TD3. However, the present disclosure is not limited in this regard.

Since the connection relationships and operations of the other components of the artificial neuromorphic circuit 7000 are similar to those of the artificial neuromorphic circuit 6000 of FIG. 6, a description in this regard is not provided.

Figure 8:
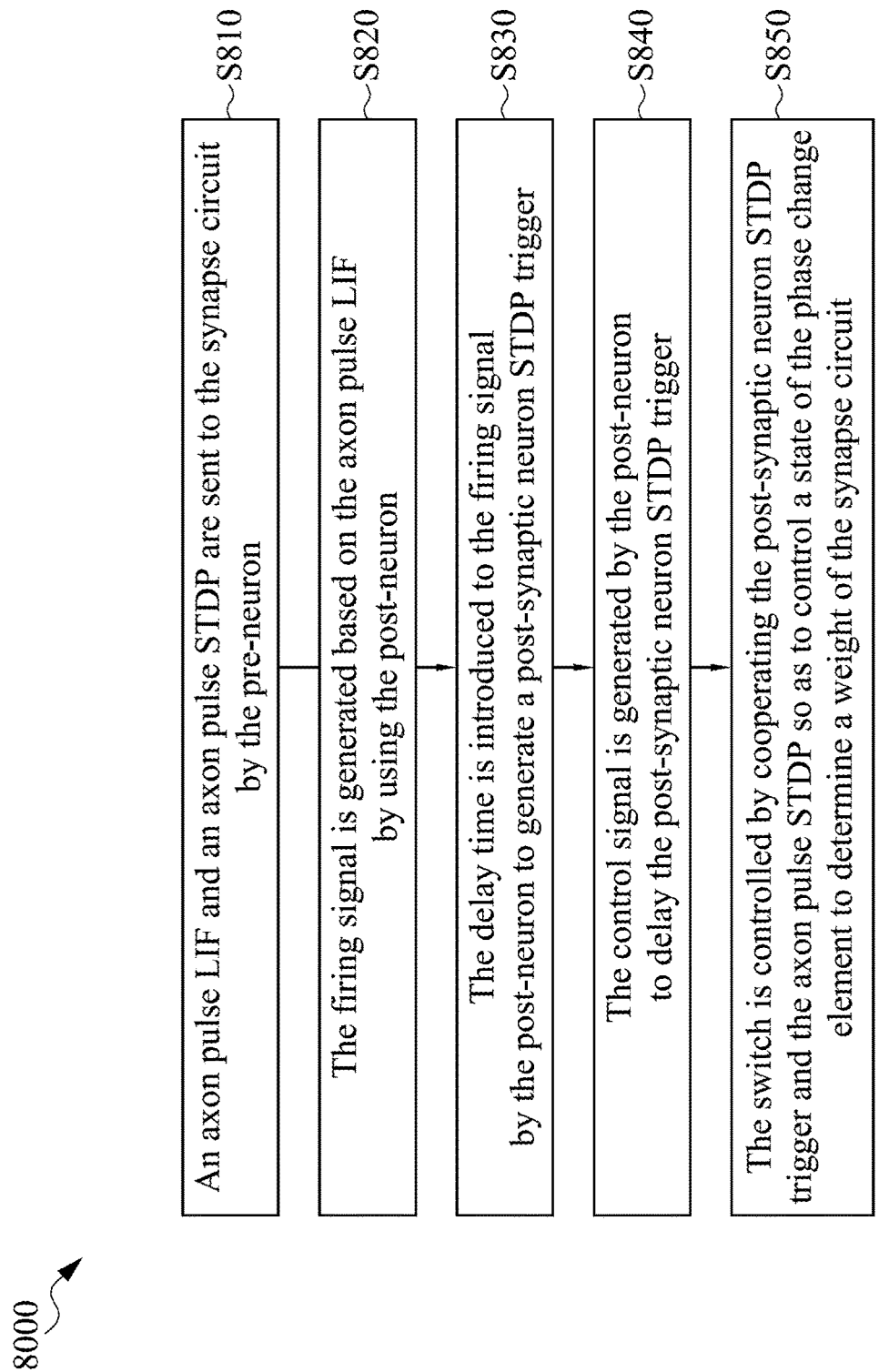
FIG. 8 depicts a flowchart of an operation method of an artificial neuromorphic circuit according to some embodiments of the present disclosure.

A description is provided with reference to FIG. 8. FIG. 8 depicts a flowchart of an operation method 800 of an artificial neuromorphic circuit according to some embodiments of the present disclosure. Take the example shown in FIG. 8 as an example, the operation method 8000 includes an operation S810, an operation S820, an operation S830, an operation S840, and an operation S850. In some embodiments, the operation method 8000 is applied to the artificial neuromorphic circuit 1000 of FIG. 1, but the present disclosure is not limited in this regard. To facilitate understanding, a discussion is provided with reference to FIG. 1 as follows.

In operation S810, an axon pulse LIF (the pulse signal PS1) and an axon pulse STDP (the pulse signal PS2) are sent to the synapse circuit 1200 by the pre-neuron 1300. In some embodiments, the synapse circuit 1200 plays the role similar to an axon of a pre-neuron to emit the axon pulse STDP (the pulse signal PS2) to the post-neuron 1400.

In operation S820, the firing signal FIRE is generated based on the axon pulse LIF (the pulse signal PS1) by using the post-neuron 1400. In some embodiments, the post-neuron 1400 plays the role similar to dendrites of a post-neuron to receive a signal from the synapse circuit 1200. The axon pulse LIF (the pulse signal PS1) charges a capacitor at the integration terminal CP of the post-neuron 1400. The firing signal FIRE is generated after a membrane potential at the integration terminal CP is compared with the threshold voltage $V_{th}$.

In operation S830, the delay time td is introduced to the firing signal FIRE by the post-neuron 1400 to generate a post-synaptic neuron STDP trigger (the control signal CS2). In some embodiments, the delay circuit TD1 will introduce the delay time td to the firing signal FIRE so as to output the post-synaptic neuron STDP trigger (the control signal CS2).

In operation S840, the control signal CS3 is generated by the post-neuron 1400 to delay the post-synaptic neuron STDP trigger (the control signal CS2). In some embodiments, the delay circuit TD2 will introduce the delay time td to the post-synaptic neuron STDP trigger (the control signal CS2) so as to output the control signal CS3. The control signal CS3 is used to control the switch S2 and the switch S3 to allow the integration terminal CP to be maintained at a high voltage level for a period of twice the delay time td.

In operation S850, the switch SW2 is controlled by cooperating the post-synaptic neuron STDP trigger (the control signal CS2) and the axon pulse STDP (the pulse signal PS2) so as to control a state of the phase change element PCM to determine a weight of the synapse circuit 1200. In some embodiments, if a pulse duration of the post-synaptic neuron STDP trigger (the control signal CS2) falls into a later time zone of the axon pulse STDP (the pulse signal PS2), a resistance of the phase change element PCM of the synapse circuit 1200 becomes lower, so the weight of the synapse circuit 1200 is increased. In some embodiments, if the pulse duration of the post-synaptic neuron STDP trigger (the control signal CS2) falls into a previous time zone of the axon pulse STDP (the pulse signal PS2), the resistance of the phase change element PCM of the synapse circuit 1200 becomes higher, so the weight of the synapse circuit 1200 is depressed.

The above description of the operation method 8000 includes exemplary operations, but the operations of the operation method 8000 are not limited to the order shown. The order of the operations of the operation method 8000 may be changed, or the operations may be performed simultaneously, partially simultaneously, or partially omitted under appropriate circumstances, which are all within the spirit and scope of the embodiments of the present disclosure.

In summary, the artificial neuromorphic circuit and operation method of the present disclosure can utilize circuits to build an artificial neural network system.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An artificial neuromorphic circuit comprising:
a synapse circuit comprising a phase change element and being configured to receive a first pulse signal and a second pulse signal; and
a post-neuron circuit coupled to the synapse circuit, wherein the post-neuron circuit comprises an input terminal, an output terminal, and an integration terminal, wherein the integration terminal being charged to a membrane potential according to the first pulse signal, wherein the post-neuron circuit further comprises:
a first control circuit coupled between the integration terminal and the output terminal, the first control circuit being configured to generate a firing signal at the output terminal based on the membrane potential;
a second control circuit coupled to the output terminal, the second control circuit being configured to generate a first control signal based on the firing signal;
a first delay circuit configured to delay the firing signal to generate a second control signal; and
a second delay circuit configured to delay the second control signal to generate a third control signal;
wherein the first control signal and the third control signal are configured to control a voltage level of the integration terminal and maintain the integration terminal at a fixed voltage during a period, and the second control signal is configured to cooperate with the second pulse signal to control a state of the phase change element so as to determine a weight of the artificial neuromorphic circuit.

2. The artificial neuromorphic circuit of claim 1, further comprising:
a pre-neuron circuit coupled to the synapse circuit, the pre-neuron circuit being configured to generate the first pulse signal and the second pulse signal, and transmitting the first pulse signal and the second pulse signal to the synapse circuit.

3. The artificial neuromorphic circuit of claim 1, wherein the first control circuit comprises:
a comparator configured to compare the membrane potential and a threshold voltage to generate a comparison signal; and
a wave shaping circuit configured to generate the firing signal based on the comparison signal.

4. The artificial neuromorphic circuit of claim 1, wherein the post-neuron circuit further comprises:
a first switch coupled among the second control circuit, a power voltage, and the integration terminal, the first switch being controlled by the first control signal.

5. The artificial neuromorphic circuit of claim 4, wherein the post-neuron circuit further comprises:
a second switch coupled between the integration terminal and a ground terminal; and
a third switch coupled between the output terminal and the ground terminal;
wherein the second switch and the third switch are controlled by the third control signal.

6. The artificial neuromorphic circuit of claim 1, wherein the second control circuit comprises:
an inverter configured to receive the firing signal so as to generate the first control signal.

7. The artificial neuromorphic circuit of claim 1, wherein the second control circuit comprises:
a filter circuit configured to receive the firing signal so as to generate the first control signal.

8. The artificial neuromorphic circuit of claim 1, wherein the second control circuit comprises:
an inverter configured to receive the firing signal so as to generate an inverted signal; and
a filter circuit configured to generate the first control signal based on the inverted signal.

9. The artificial neuromorphic circuit of claim 1, wherein the synapse circuit further comprises:
an axon pulse switch, wherein a first terminal of the axon pulse switch is configured to receive the first pulse signal; and
an axon plastic switch, wherein a first terminal of the axon plastic switch is configured to receive the second pulse signal, wherein a second terminal of the axon pulse switch and a second terminal of the axon plastic switch are coupled to the phase change element, and the phase change element is coupled to the post-neuron circuit.

10. An operation method of an artificial neuromorphic circuit comprising:
receiving a first pulse signal and a second pulse signal by using a synapse circuit;
generating a firing signal based on the first pulse signal, and generating a first control signal based on the firing signal by using a post-neuron circuit, wherein the first control signal is configured to control a voltage level of an integration terminal of the post-neuron circuit;
delaying the firing signal to generate a second control signal by using the post-neuron circuit; and delaying the second control signal to generate a third control signal by using the post-neuron circuit, wherein the third control signal is configured to control the voltage level of the integration terminal of the post-neuron circuit, wherein the second control signal is configured to cooperate with the second pulse signal to control a state of a phase change element so as to determine a weight of the artificial neuromorphic circuit.

11. The operation method of claim 10, wherein the post-neuron circuit comprises a first control circuit, and generating the firing signal comprises:

comparing the voltage level of the integration terminal and a threshold voltage by using a comparator of the first control circuit to generate a comparison signal; and generating the firing signal based on the comparison signal by using a wave shaping circuit of the first control circuit.

12. The operation method of claim 10, wherein the post-neuron circuit comprises a second control circuit and the operation method further comprises:

generating the first control signal based on the firing signal by using the second control circuit; and controlling a switch of the post-neuron circuit according to the first control signal.

13. The operation method of claim 12, wherein generating the first control signal comprises:

receiving the firing signal by using a filter circuit of the second control circuit to generate the first control signal.

14. The operation method of claim 12, wherein generating the first control signal comprises:

receiving the firing signal by using an inverter of the second control circuit to generate the first control signal.

15. The operation method of claim 12, wherein generating the first control signal comprises:

receiving the firing signal by using an inverter of the second control circuit; and generating the first control signal based on the inverted firing signal by using a filter circuit of the second control circuit.

16. The operation method of claim 10, wherein generating the second control signal and the third control signal comprises:

delaying the firing signal by using a first delay circuit of the post-neuron circuit to generate the second control signal; and delaying the second control signal by using a second delay circuit of the post-neuron circuit to generate the third control signal.

* * * * *